United States Patent
Chao et al.

(10) Patent No.: US 12,105,176 B2
(45) Date of Patent: Oct. 1, 2024

(54) TROUBLESHOOTING SYSTEM AND METHOD FOR CURRENT SENSORS

(71) Applicant: Delta Electronics, Inc., Taoyuan (TW)

(72) Inventors: Kuo-Heng Chao, Taoyuan (TW); Chia-Hsiang Chuang, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 161 days.

(21) Appl. No.: 17/837,741

(22) Filed: Jun. 10, 2022

(65) Prior Publication Data

US 2023/0121422 A1 Apr. 20, 2023

Related U.S. Application Data

(60) Provisional application No. 63/256,189, filed on Oct. 15, 2021.

(30) Foreign Application Priority Data

Apr. 19, 2022 (CN) .......................... 202210410396.1

(51) Int. Cl.
*G01R 35/00* (2006.01)
*G01R 19/00* (2006.01)
(Continued)

(52) U.S. Cl.
CPC .......... *G01R 35/00* (2013.01); *G01R 19/0038* (2013.01); *G01R 31/2837* (2013.01);
(Continued)

(58) Field of Classification Search
CPC ................ G01R 35/00; G01R 19/0038; G01R 31/2837; G01R 31/2839; H02K 11/33;
(Continued)

(56) References Cited

U.S. PATENT DOCUMENTS

2010/0033122 A1 2/2010 Hartman et al.
2018/0358888 A1* 12/2018 Depreville ................ H02J 3/36
(Continued)

FOREIGN PATENT DOCUMENTS

CN 103715955 A 4/2014
CN 204142841 U 2/2015
(Continued)

*Primary Examiner* — Zoheb S Imtiaz
(74) *Attorney, Agent, or Firm* — KIRTON McCONKIE; Evan R. Witt

(57) ABSTRACT

The present disclosure provides a troubleshooting system for current sensors including a motor, three current sensors and a controller. The three current sensors respectively sense three phase currents of the three-phase current of the motor to obtain three current sensing values. The controller is configured to control the three-phase current of the motor. When the sum of the three current sensing values is greater than a threshold, the controller controls the three phase currents to be zero, and a first offset sensor and a current offset are obtained. When the sum of the three current sensing values equals the current offset, a second offset sensor is obtained. If the first offset sensor and the second offset sensor are the same current sensor, the controller outputs a warning signal, if the first offset sensor and the second offset sensor are different current sensors, the controller controls the motor to stop operating.

10 Claims, 4 Drawing Sheets

(51) Int. Cl.
    *G01R 31/28*     (2006.01)
    *H02H 1/00*     (2006.01)
    *H02H 3/04*     (2006.01)
    *H02H 3/10*     (2006.01)
    *H02H 7/08*     (2006.01)
    *H02K 11/33*     (2016.01)
    *H02P 6/182*     (2016.01)
    *H02P 6/20*     (2016.01)
    *H02P 6/24*     (2006.01)
    *H02P 27/06*     (2006.01)
    *H03K 17/081*     (2006.01)
    *H03K 17/687*     (2006.01)

(52) U.S. Cl.
    CPC ....... *G01R 31/2839* (2013.01); *H02H 1/0007* (2013.01); *H02H 3/044* (2013.01); *H02H 3/10* (2013.01); *H02H 7/08* (2013.01); *H02K 11/33* (2016.01); *H02P 6/20* (2013.01); *H02P 6/24* (2013.01); *H02P 27/06* (2013.01); *H03K 17/08104* (2013.01); *H03K 17/687* (2013.01); *H02P 6/182* (2013.01)

(58) Field of Classification Search
    CPC ........ H02H 1/0007; H02H 3/044; H02H 3/10; H02H 7/08; H02P 6/20; H02P 6/24; H02P 27/06; H03K 17/08104; H03K 17/687
    See application file for complete search history.

(56) References Cited

U.S. PATENT DOCUMENTS

2021/0213837 A1\*   7/2021   Proietty ................ B60L 15/025
2021/0316630 A1\*  10/2021   Lee .......................... B60L 53/62

FOREIGN PATENT DOCUMENTS

| CN | 111953258 A | 11/2020 |
| CN | 112398375 A | 2/2021 |
| TW | I512310 B | 12/2015 |
| TW | I705653 B | 9/2020 |
| WO | 2019065545 A1 | 4/2019 |

\* cited by examiner

TROUBLESHOOTING SYSTEM AND METHOD FOR CURRENT SENSORS

CROSS-REFERENCE TO RELATED APPLICATION

This application claims the benefit of U.S. Provisional Application No. 63/256,189, filed on Oct. 15, 2021, entitled "TROUBLESHOOTING METHOD AND OVER-CURRENT PROTECTION SYSTEM FOR CURRENT SENSOR AND SAFETY MECHANISM FOR ABNORMAL POWER SUPPLY". This application claims priority to China Patent Application No. 202210410396.1, filed on Apr. 19, 2022, the entire contents of which are incorporated herein by reference for all purposes.

FIELD OF THE INVENTION

The present disclosure relates to a troubleshooting system and method for current sensors, and more particularly to a troubleshooting system and method for utilizing a current sensing value to find the faulty current sensor without stopping the motor.

BACKGROUND OF THE INVENTION

Conventionally, two current sensors are utilized to sense two phase currents of the motor respectively, and the third phase current of the motor is calculated by the characteristics that the sum of the three phase currents equals zero. However, in order to meet the safety requirements, it is necessary to detect whether the current sensor of the motor is abnormal. Therefore, a third phase current sensor is added for abnormal detection.

When the current sensor of the motor is faulty, in the circumstance that the motor does not stop operating, the conventional troubleshooting method can only utilize the sensing result of the three phase currents to determine whether the current sensor is abnormal. However, since the current sensor has many types of error forms, such as stucking at output voltage, abnormal current gain and zero current output offset, the conventional troubleshooting method cannot accurately identify which current sensor is faulty, or even misjudgments may occur. If the motor is stopped for testing every current sensor carefully, the motor will be unable to operate continuously.

Therefore, there is a need of providing a troubleshooting system and method for current sensors to obviate the drawbacks encountered from the prior arts.

SUMMARY OF THE INVENTION

It is an object of the present disclosure to provide a troubleshooting system and method for current sensors. Without stopping the motor, the faulty current sensor can be accurately identified by controlling the phase current and sensing the value of the phase current, so as to overcome the misjudgment easily made by the conventional troubleshooting system.

In accordance with an aspect of the present disclosure, there is provided a troubleshooting system for current sensors. The troubleshooting system for current sensors includes a motor, three current sensors and a controller. The motor has a three-phase current. The three current sensors respectively sense three phase currents of the three-phase current of the motor to obtain three current sensing values corresponding to the three phase currents respectively. The controller is electrically connected to the three current sensors and the motor and is configured to control the three-phase current of the motor. When the sum of the three current sensing values is greater than a threshold, the controller controls the three phase currents to be zero, and the current sensor that senses the current sensing value with the largest difference from zero is regarded as a first offset sensor, and there is a current offset between the current sensing value sensed by the first offset sensor and zero. After obtaining the first offset sensor and the current offset and when the sum of the three current sensing values equals the current offset, the controller regards the current sensor with the current sensing value closest to zero among the three current sensing values as a second offset sensor. If the first offset sensor and the second offset sensor are the same current sensor, the controller outputs a warning signal. If the first offset sensor and the second offset sensor are different current sensors, the controller controls the motor to stop operating.

In accordance with an aspect of the present disclosure, there is provided a troubleshooting method for current sensors. The troubleshooting method including steps of: (a) providing a motor, three current sensors and a controller, wherein the motor has a three-phase current, the three current sensors respectively sense three phase currents of the three-phase current of the motor to obtain three current sensing values corresponding to the three phase currents respectively, the controller is electrically connected to the three current sensors and the motor and is configured to control the three-phase current of the motor; (b) sensing the three phase currents; (c) controlling the three phase currents to be zero when the sum of the three current sensing values being greater than a threshold; (d) regarding the current sensor that senses the current sensing value with the largest difference from zero as a first offset sensor, wherein there is a current offset between the current sensing value sensed by the first offset sensor and zero; (e) sensing the three phase currents; (f) regarding the current sensor with the current sensing value closest to zero among the three current sensing values as a second offset sensor when the sum of the three current sensing values equaling the current offset; (g) determining whether the first offset sensor and the second offset sensor are the same current sensor, wherein a step (h) is performed if the determination result of the step (g) is satisfied, and a step (i) is performed if the determination result of the step (g) is not satisfied; (h) controlling the motor to operate continuously and outputting a warning signal; and (i) controlling the motor to stop operating.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
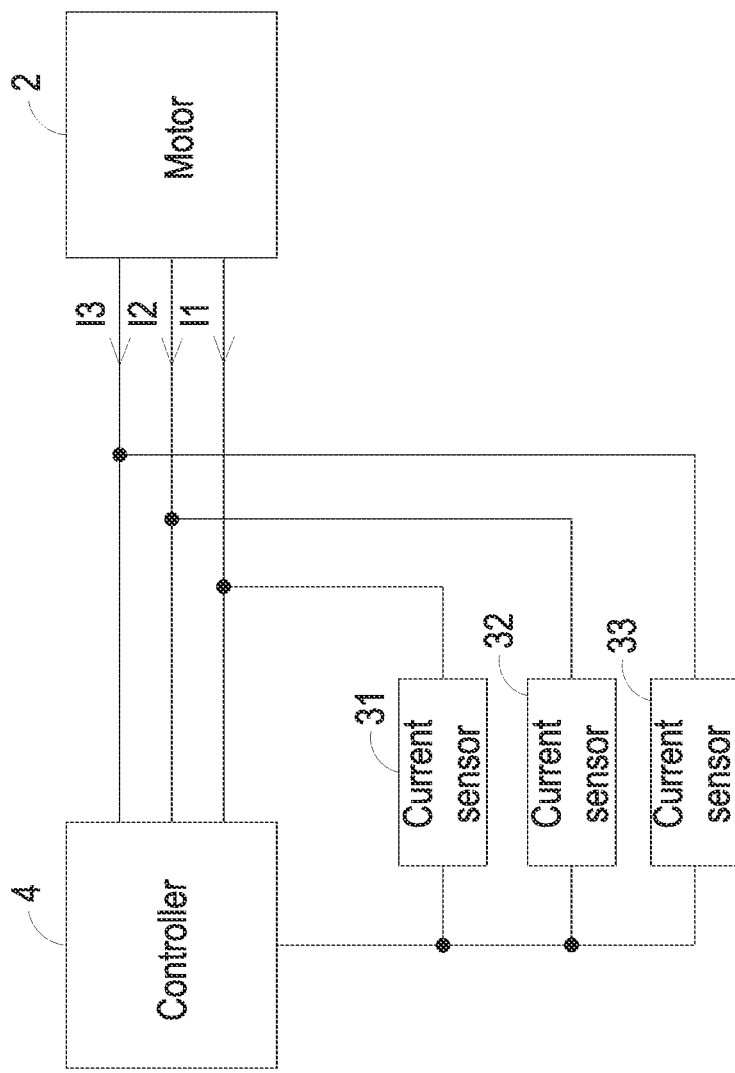
FIG. 1 is a schematic circuit diagram illustrating a troubleshooting system for current sensors according to an embodiment of the present disclosure.

FIG. 1 is a schematic circuit diagram illustrating the troubleshooting system for current sensors according to an embodiment of the present disclosure. As shown in FIG. 1, the troubleshooting system 1 for current sensors includes a motor 2, three current sensors 31, 32 and 33 and a controller 4. The three current sensors 31, 32 and 33 respectively sense three phase currents I1, I2 and I3 of the three-phase current of the motor 2, thereby obtaining three current sensing values L1, L2 and L3 (not shown in the FIG.) corresponding to the three phase currents I1, I2 and I3 respectively. The controller 4 is electrically connected to the three current sensors 31, 32 and 33 and the motor 2, and is configured to control the three-phase current of the motor 2. In an embodiment, the controller 4 includes a three-phase switch and a switch driver. The three-phase switch is configured to turn on or off the three-phase current of the motor 2, and the controller 4 utilizes the switch driver to control the three-phase switch.

When the motor 2 is operating, the three current sensors 31, 32 and 33 sense the three-phase current of the motor 2 continuously. When the sum of the three current sensing values L1, L2 and L3 is greater than a threshold Y, at least one of the three current sensors 31, 32 and 33 is faulty. Under this circumstance, the controller 4 performs a zero-current test, namely the controller 4 controls the three phase currents I1, I2 and I3 to be zero. After performing the zero-current test for a period of time d (i.e., the response time of the three-phase current of the motor 2 after receiving the zero-current test command), the controller 4 compares the three current sensing values L1, L2 and L3 at a time point T. The current sensor that senses the current sensing value with the largest difference from zero is regarded as a first offset sensor, and there is a current offset D1 between the current sensing value sensed by the first offset sensor and zero. Therefore, after the zero-current test is performed for the period of time d, the first offset sensor is the current sensor with the largest current offset among the three current sensors 31, 32 and 33. In an embodiment, the magnitude of the threshold value Y depends on the magnitude of the sensing error values of the three current sensors 31, 32 and 33. For example, when the sensing error values of the three current sensors 31, 32 and 33 are relatively large, the threshold value Y is correspondingly large. On the contrary, when the sensing errors values of the three current sensors 31, 32 and 33 are relatively small, the threshold Y is correspondingly small.

The motor 2 resumes normal operation after obtaining the first offset sensor and the current offset D1, that is, the three phase currents I1, I2 and I3 return to normal and are no longer controlled to be zero. After the motor 2 resumes normal operation, the three current sensors 31, 32 and 33 sense the three-phase current again to obtain the three current sensing values L1, L2 and L3 at present. When the sum of the three current sensing values L1, L2 and L3 equals the current offset D1, the controller 4 compares the current sensing values L1, L2 and L3, and the current sensor with the current sensing value closest to zero among the three current sensing values L1, L2 and L3 is regarded as a second offset sensor.

If the first offset sensor and the second offset sensor are the same current sensor, the controller 4 outputs a warning signal, and the warning signal includes a faulty message of the current sensor. If the first offset sensor and the second offset sensor are different current sensors, the controller 4 controls the motor 2 to stop operating. In an embodiment, when the current offset D1 is greater than the threshold Y and the first offset sensor and the second offset sensor are different current sensors, the controller 4 controls the motor 2 to stop operating. Without stopping the motor, the troubleshooting system 1 for current sensors of the present disclosure can identify the faulty current sensor accurately by controlling the phase current and sensing the value of the phase current, so as to overcome the misjudgment easily made by the conventional troubleshooting system.

Figure 2:
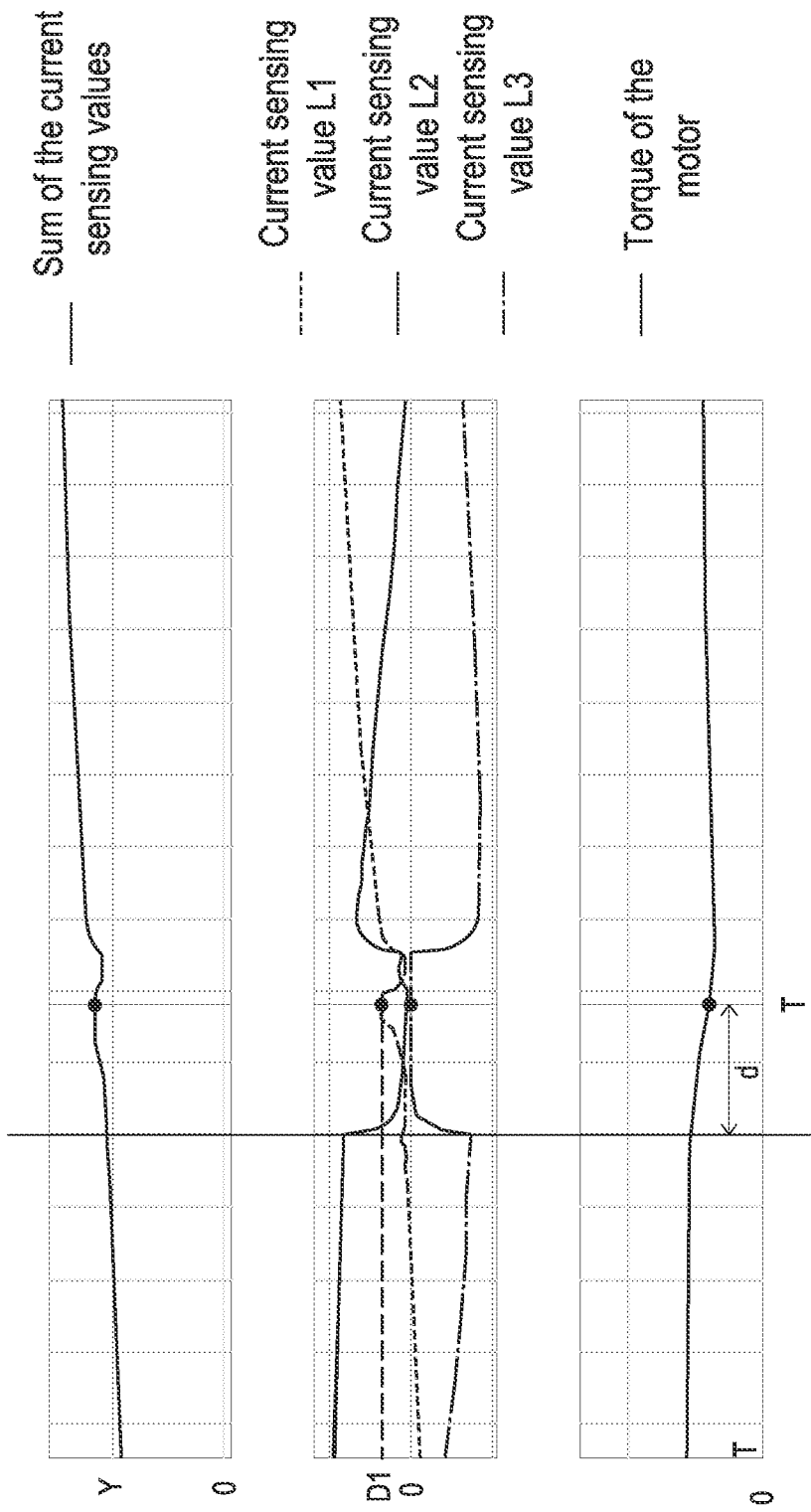
FIG. 2 schematically shows the waveforms of a sum of the three current sensing values, three current sensing values and an output torque of the motor of FIG. 1.
Figure 3:
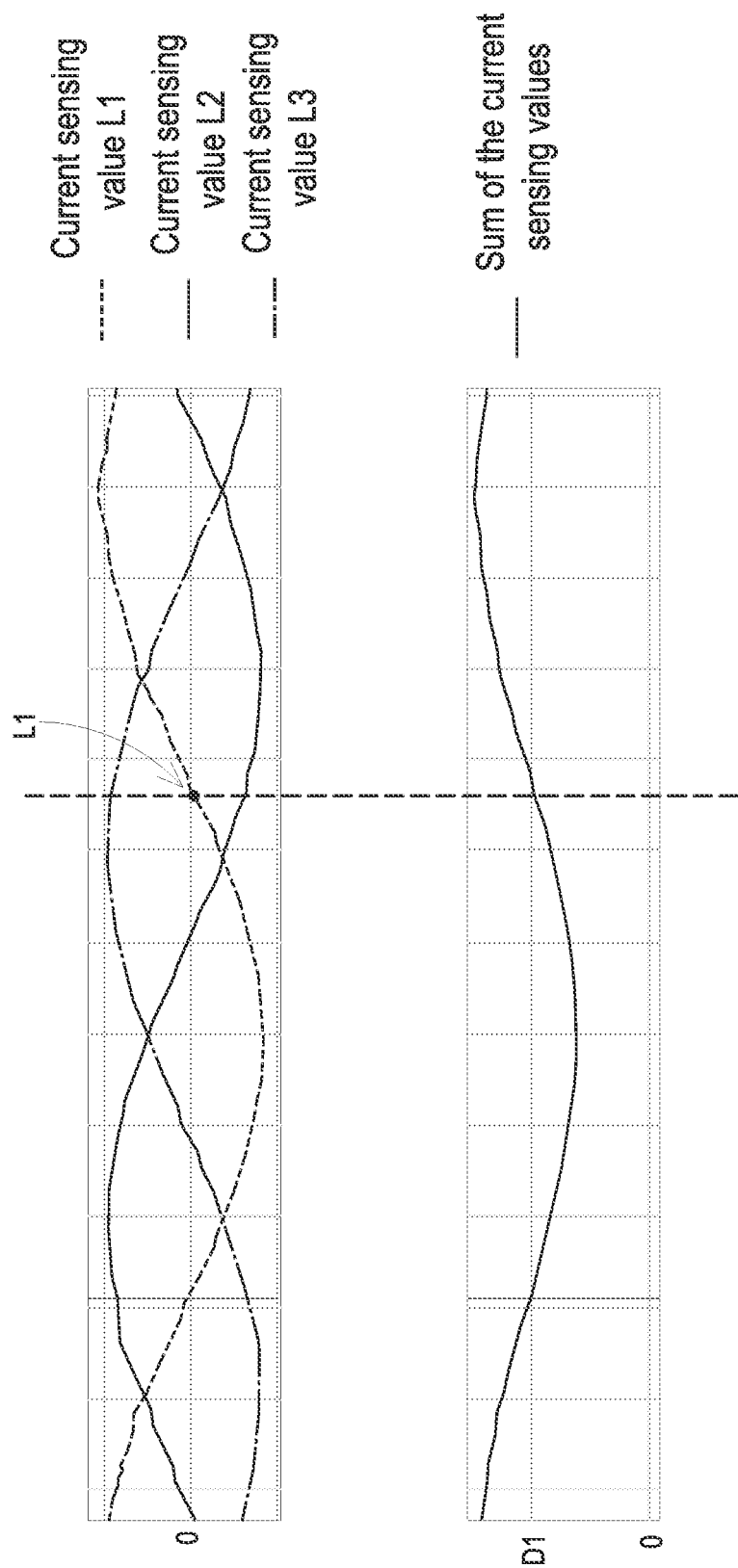
FIG. 3 schematically shows the waveforms of the sum of the three current sensing values and the three current sensing values after obtaining the first offset sensor and the current offset according to FIG. 2.

FIGS. 2 and 3 are exemplified to describe the process of obtaining the first and the second offset sensors. FIG. 2 schematically shows the waveforms of the sum of the three current sensing values, three current sensing values and the output torque of the motor. As shown in FIG. 2, when the sum of the three current sensing values L1, L2 and L3 is greater than the threshold Y, the controller 4 controls the three phase currents I1, I2 and I3 to be zero (i.e., the zero-current test shown in FIG. 2). After the zero-current test is performed for the period of time d, the controller 4 compares the three current sensing values L1, L2 and L3 with zero respectively at a time point T. In this embodiment, at the time point T, the current sensing value with the largest difference from zero is L1. Therefore, the current sensor 31 that senses the current sensing value L1 is the first offset sensor, and the difference between the current sensing value L1 sensed by the current sensor 31 and zero equals the current offset D1.

FIG. 3 schematically shows the waveforms of the sum of the three current sensing values L1, L2 and L3 and the three current sensing values L1, L2 and L3. After obtaining the first offset sensor and the current offset D1, the motor 2 resumes normal operation, and the three phase currents I1, I2 and I3 resume normal. Meanwhile, the current sensors 31, 32 and 33 sense the three current sensing values L1, L2 and L3 again. When the sum of the three current sensing values L1, L2 and L3 equals the current offset D1, the controller 4 compares the three current sensing values L1, L2 and L3 with zero respectively. In this embodiment, when the sum of the three current sensing values L1, L2 and L3 equals the current offset D1, the current sensing value closest to zero is L1. Therefore, the current sensor 31 that senses the current sensing value L1 is the second offset sensor. In the embodiment shown in FIGS. 2 and 3, the first offset sensor and the second offset sensor are the same current sensor (i.e., the current sensor 31). Therefore, the current sensor 31 is the faulty current sensor, and the controller 4 outputs the warning signal including the faulty message of the current sensor 31.

Figure 4:
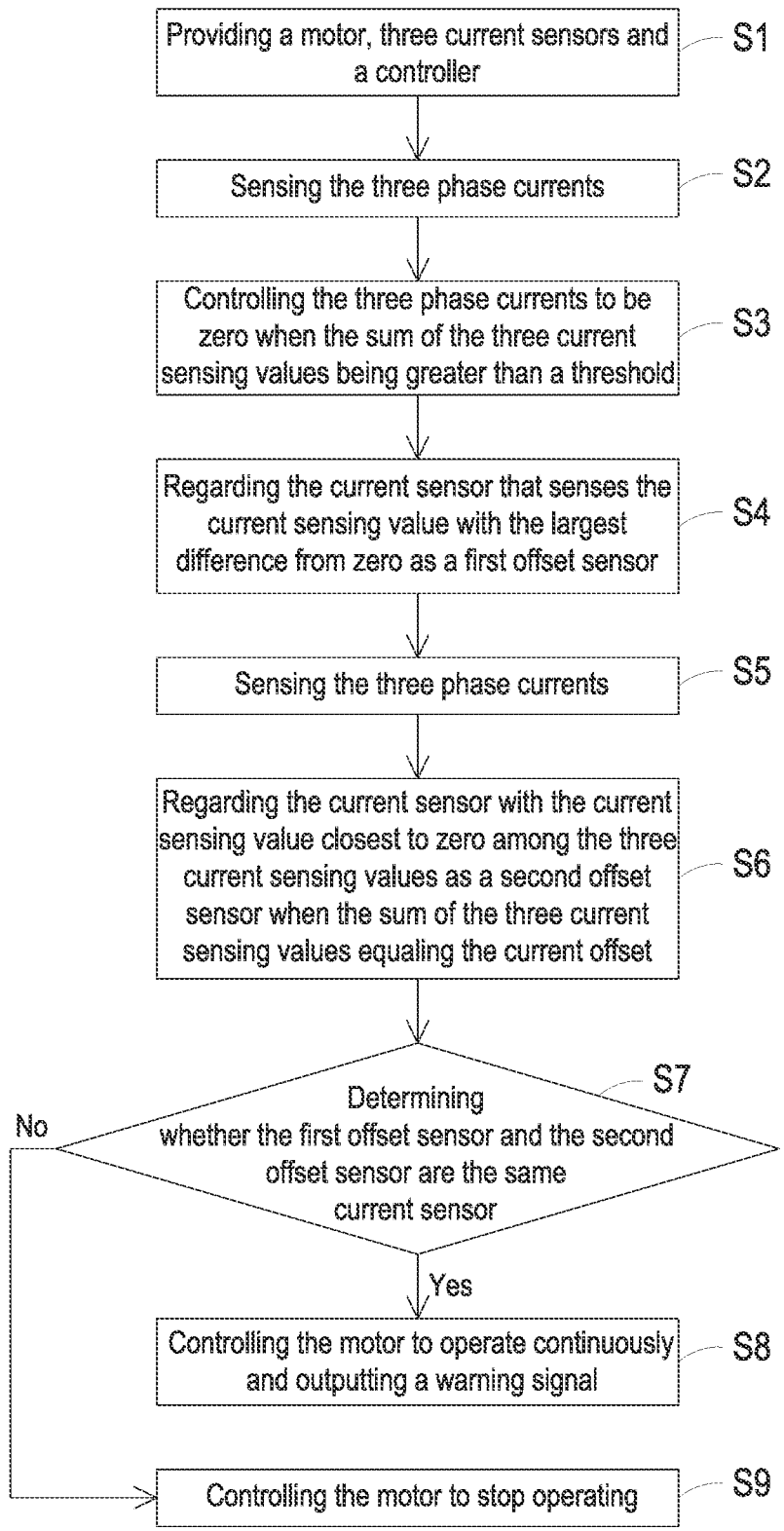
FIG. 4 is a schematic flow chart illustrating a troubleshooting method for current sensors according to an embodiment of the present disclosure.

FIG. 4 is a schematic flow chart illustrating a troubleshooting method for current sensors according to an embodiment of the present disclosure. The troubleshooting method for current sensors of the present disclosure is applicable for the troubleshooting system 1 for current sensors stated above. As shown in FIG. 4, the troubleshooting method for current sensors includes the steps S1, S2, S3, S4, S5, S6, S7, S8 and S9. In the step S1, a motor 2, three current sensors 31, 32 and 33 and a controller 4 are provided (please also refer to the FIG. 1). The motor 2 has a three-phase current, and the three current sensors 31, 32, 33 respectively sense three phase currents I1, I2 and I3 of the three-phase current of the motor 2, thereby obtaining three current sensing values L1, L2 and L3 corresponding to the three phase currents I1, I2 and I3 respectively. The controller 4 is electrically connected to the three current sensors 31, 32 and 33 and the motor 2, and is configured to control the three-phase current of the motor 2. In the step S2, three phase currents I1, I2 and I3 are sensed. In the step S3, the three phase currents I1, I2 and I3 are controlled to be zero when the sum of the three current sensing values L1, L2 and L3 is greater than a threshold Y. In the step S4, the current sensor that senses the current sensing value with the largest difference from zero is regarded as a first offset sensor, and there is a current offset D1 between the current sensing value sensed by the first offset sensor and zero. In the step S5, three phase currents I1, I2 and I3 are sensed. In the step S6, when the sum of the three current sensing values L1, L2 and L3 equals the current offset D1, the current sensor with the current sensing value closest to zero among the three current sensing values L1, L2 and L3 is regarded as a second offset sensor. In the step S7, whether the first offset sensor and the second offset sensor are the same current sensor is determined. The step S8 is performed if the determination result of the step S7 is satisfied (i.e., the first offset sensor and the second offset sensor are the same sensor), and the step S9 is performed if the determination result of the step S7 is not satisfied (i.e., the first offset sensor and the second offset sensor are different sensors). In the step S8, the motor 2 is controlled to operate continuously, and a warning signal is outputted. In the step S9, the motor 2 is controlled to stop operating.

From the above descriptions, the present disclosure provides a troubleshooting system and method for current sensors. The controller controls the three phase currents to be zero to obtain a first offset sensor, and utilizes the sum of the three phase currents to obtain a second offset sensor. If the first and the second offset sensors are the same current sensors, the controller identifies that the current sensor is the faulty current sensor. Without stopping the motor, the faulty current sensor can be accurately identified by controlling the phase current and sensing the value of the phase current, so as to overcome the misjudgment easily made by the conventional troubleshooting system.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A troubleshooting system for current sensors, comprising:
   a motor having a three-phase current;
   three current sensors, wherein the three current sensors respectively sense three phase currents of the three-phase current of the motor to obtain three current sensing values corresponding to the three phase currents respectively; and
   a controller electrically connected to the three current sensors and the motor and configured to control the three-phase current of the motor,
   wherein when the sum of the three current sensing values is greater than a threshold, the controller controls the three phase currents to be zero, and the current sensor that senses the current sensing value with the largest difference from zero is regarded as a first offset sensor, and there is a current offset between the current sensing value sensed by the first offset sensor and zero,
   wherein after obtaining the first offset sensor and the current offset and when the sum of the three current sensing values equals the current offset, the controller regards the current sensor with the current sensing value closest to zero among the three current sensing values as a second offset sensor,
   wherein if the first offset sensor and the second offset sensor are the same current sensor, the controller outputs a warning signal, if the first offset sensor and the second offset sensor are different current sensors, the controller controls the motor to stop operating.

2. The troubleshooting system for current sensors according to claim 1, wherein the controller further comprises a three-phase switch for turning on or off the three-phase current of the motor.

3. The troubleshooting system for current sensors according to claim 2, wherein the controller further comprises a switch driver, the controller utilizes the switch driver to control the three-phase switch.

4. The troubleshooting system for current sensors according to claim 1, wherein the magnitude of the threshold value depends on the magnitude of three sensing error values of the three current sensors.

5. The troubleshooting system for current sensors according to claim 1, wherein when the current offset equals the threshold and the first offset sensor and the second offset sensor are different current sensors, the controller controls the motor to stop operating.

6. A troubleshooting method for current sensors, comprising steps of:
   (a) providing a motor, three current sensors and a controller, wherein the motor has a three-phase current, the three current sensors respectively sense three phase currents of the three-phase current of the motor to obtain three current sensing values corresponding to the three phase currents respectively, the controller is electrically connected to the three current sensors and the motor and is configured to control the three-phase current of the motor;
   (b) sensing the three phase currents;
   (c) controlling the three phase currents to be zero when the sum of the three current sensing values being greater than a threshold;
   (d) regarding the current sensor that senses the current sensing value with the largest difference from zero as a first offset sensor, wherein there is a current offset between the current sensing value sensed by the first offset sensor and zero;
   (e) sensing the three phase currents;
   (f) regarding the current sensor with the current sensing value closest to zero among the three current sensing values as a second offset sensor when the sum of the three current sensing values equaling the current offset;
   (g) determining whether the first offset sensor and the second offset sensor are the same current sensor, wherein a step (h) is performed if the determination result of the step (g) is satisfied, and a step (i) is performed if the determination result of the step (g) is not satisfied;

(h) controlling the motor to operate continuously and outputting a warning signal; and (i) controlling the motor to stop operating.

7. The troubleshooting method for current sensors according to claim 6, wherein the controller further comprises a three-phase switch for turning on or off the three-phase current of the motor.

8. The troubleshooting method for current sensors according to claim 7, wherein the controller further comprises a switch driver, the controller utilizes the switch driver to control the three-phase switch.

9. The troubleshooting method for current sensors according to claim 6, wherein the magnitude of the threshold value depends on the magnitude of three sensing error values of the three current sensors.

10. The troubleshooting method for current sensors according to claim 6, wherein when the current offset equals the threshold and the first offset sensor and the second offset sensor are different current sensors, the controller controls the motor to stop operating.

* * * * *